United States Patent [19]
Yoshida et al.

[11] Patent Number: 5,286,978
[45] Date of Patent: Feb. 15, 1994

[54] METHOD OF REMOVING ELECTRIC CHARGE ACCUMULATED ON A SEMICONDUCTOR SUBSTRATE IN ION IMPLANTATION

[75] Inventors: Yukimasa Yoshida; Katsuya Okumura, both of Yokohama, Japan

[73] Assignee: Kabushiki Kaisha Toshiba, Kawasaki, Japan

[21] Appl. No.: 976,335

[22] Filed: Nov. 13, 1992

Related U.S. Application Data

[63] Continuation-in-part of Ser. No. 600,768, Oct. 23, 1990, abandoned.

[30] Foreign Application Priority Data

Oct. 25, 1989 [JP] Japan .................................. 1-276012

[51] Int. Cl.⁵ .......................................... H01V 37/317
[52] U.S. Cl. .............................. 250/492.21; 250/398; 250/251
[58] Field of Search .................... 250/492.21, 398, 251

[56] References Cited

U.S. PATENT DOCUMENTS

4,639,301 6/1989 Doherty et al. ...................... 250/251
4,939,360 7/1990 Sakai .................................... 250/251

FOREIGN PATENT DOCUMENTS

WO91/13458 9/1991 World Int. Prop. O. .

OTHER PUBLICATIONS

Patent Abstracts Of Japan, vol. 13, No. 534 (E-852) 29 Nov. 1989 of JP-A-1 220 350.

*Primary Examiner*—Jack I. Berman
*Attorney, Agent, or Firm*—Foley & Lardner

[57] ABSTRACT

A method of removing electric charges accumulated on a semiconductor substrate during ion implantation by irradiating a highly accelerated electron beam with an acceleration energy of 1 to 50 KeV into the portion of the substrate irradiated with ion beams. The so-formed electron beam induced current eliminates the electric charges.

6 Claims, 4 Drawing Sheets

METHOD OF REMOVING ELECTRIC CHARGE ACCUMULATED ON A SEMICONDUCTOR SUBSTRATE IN ION IMPLANTATION

This application is a continuation-in-part of pending application Ser. No. 07/600,768, filed Oct. 23, 1990, now abandoned.

BACKGROUND OF THE INVENTION

1. Field of the Invention

The present invention relates to ion implantation, and particularly to a method of removing the electric charge accumulated on a semiconductor substrate in ion implantation.

2. Description of the Prior Art

The integration degree of integrated circuits has been increased about four times over the past three years. Improvements in integration degree have been achieved by making finely structured semiconductor devices. In order to make such a device extremely fine, it is necessary and effective to reduce the thicknesses of the insulating films used in the devices. For example, in a usual MOS type device, a silicon oxide film ($SiO_2$) with a thickness of 100 Å is generally used as the insulating film. The insulating film is formed by so-called ion implantation, in which positive ions are accelerated toward the substrate of the device and implanted therein at a high speed.

Positive electric charge therefore accumulates on the substrate (charge-up phenomenon), so that the insulating film is likely to be destroyed when an excessive electric stress is applied thereto. As the result, the reliability of the semiconductor device is degraded, and productivity thereof lowered.

To prevent the charge-up phenomenon, there is a known method in which an electron beam is irradiated to the substrate or ion beam by using an electron flat gun (EFG).

FIG. 1 shows a cross section of a conventional ion implantation apparatus. An ion beam 51 which emerges from an ion source (not shown) is accelerated, then implanted into a semiconductor substrate 53 mounted on a disc 52. In the same figure, electron flat gun (EFG) 54 prevents positive charge-up to be generated on the surface of the substrate 53 by the ion beam 51. In the electron flat gun 54, primary electrons generated from a tungsten (W) wire 55 are accelerated, then collide with a target 57, so that secondary electrons 58 are generated from the target 57. Thereafter, the secondary electrons 58 are introduced on the substrate 53, so that the positive electric charge having accumulated on the substrate 53 is neutralized. The amount of the secondary electron beam irradiated on the substrate 53 can be detected by monitoring the flow of secondary electrons 56 to the disc 52, further controlled by changing values of voltage 59 applied for generating the secondary electrons 56.

However, since the degree of charge-up varies with conditions of the surface structure of the substrate 53, it is very difficult to adjust most suitably the irradiation amount of the electron beam 56 given from the EFG 54 for satisfying all the surface conditions of the substrate 53. For example, when the amount of the irradiation of the electron beam 56 exceeds an amount just corresponding to the amount of charge-up, the surface of the substrate 53 is charged negatively. Moreover, in case of a CMOS type semiconductor device, the amount of the P channel portion thereof is different from that of the N channel portion. Therefore, it is impossible to prevent the charge-up phenomena from being generated on both of the channel sides simultaneously by the conventional method.

On the other hand, to prevent the charge-up phenomenon, it is also possible to reduce the amount of the ion beam without using the EFG, or to substantially reduce the amount per predetermined period by decreasing the duty ratio. However, when the dose of ion beams is relatively large, the throughput of the ion implantation is inevitably degraded. Accordingly, these methods are not so effective to solve these problems either.

FIG. 2 shows a cross section of a semiconductor substrate 64 for detecting electrical damage caused by conventional ion implantation, described above.

In fabrication of the semiconductor substrate 64, an $SiO_2$ film 62 with a thickness of 200 Å is first formed on a P type silicon (Si) substrate 61. A phosphorous-diffusion poly silicon film (Poly Si) 63 with a thickness of 4000 Å is then formed on the $SiO_2$ film 62. Thereafter, the Poly Si 63 is processed by the CDE method (chemical dry etching), so as not to damage the substrate composition. The processed material is then annealed for about 60 minutes in a $N_2$ gas atmosphere at 900° C., so as to obtain the semiconductor substrate 64.

FIG. 3 is a diagram showing the relationship between a failure rate concerning insulating property and an applied electric field with respect to the substrate 64 subjected to conventional high-dose ion implantation. In the diagram, the horizonal axis shows the electric field applied to the poly Si 61 (where the Si substrate 61 is set at ground voltage), and the vertical axis shows the failure rate thereof.

As clearly seen from the same figure, when an EFG is not used for ion implantation, the insulating resistance of some resultant substrate 64 is destroyed under the condition of the electric field less than 1 MV/cm. The failure rate thereof is shown by the shaded portion 71, in FIG. 3.

On the other hand, when the current of the EFG is used in the predetermined range for ion implantation, the failure rate of the resultant insulating resistance is as high as that of the normal $SiO_2$ film (8.5 to 9.5 MV/cm, shown by the shaded portion in FIG. 3).

But, when the current of the EFG is in the range greater than in the predetermined current range, the failure rate of the resulting insulating resistance of the substrate is in less than 1 MV/cm. Namely, the current of the EFG is so high that the amount of the electrons generated by it is large.

The proper range of the current applied to the EFG depends on the structure of the semiconductor substrate or the existence of the resist on the substrate can be determined.

When the current range applied to the EFG is narrow, the charge-up on the surface of the substrate is protected at one portion on the substrate, but it cannot be guarded at other portions. The amount of electrons generated by the EFG is not so large as to neutralize the positive electric charge on the surface of the substrate or is not lacking in order to delete it. In these cases, the substrate is charged with positive electric charge in the positive state, with electrons in the negative state.

SUMMARY OF THE INVENTION

Accordingly, it is an object to provide a method of removing, or preventing the generation of, electric charge applied to a semiconductor substrate in the ion implantation by suppressing generation of the charge-up phenomenon without any drop of the throughput of the process and without damaging the substrate.

A feature of the present invention is that the method of removing, or preventing the generation of, electric charge accumulated on a semiconductor substrate in ion implantation comprises the steps of implanting ions by irradiating an ion beam onto the semiconductor substrate so as to form an impurity layer therein and wherein a highly accelerated electron beam is irradiated onto the same portion of the semiconductor substrate on which the ion beam is irradiated.

Another feature of the present invention is that in a method having the feature mentioned above, the highly accelerated electron beam is joined with the ion beam, and irradiated onto a predetermined portion of the semiconductor substrate together with the ion beam.

As stated above, since the highly accelerated electron beam is irradiated onto the surface of the substrate on the ion implantation, an electric current is generated on the substrate by the electron beam, so that electron charge having been or to be accumulated on the surface of the substrate is canceled or removed by the electric current.

Accordingly, the destruction of the insulating film in a semiconductor device caused by electric stress can be avoided, so that the throughput in production of the device can be improved and high reliability can be guaranteed.

These and other objects, features and advantages of the present invention will be more apparent from the following description of a preferred embodiment, taken in conjunction with the accompanying drawings.

DETAILED DESCRIPTION OF THE PREFERRED EMBODIMENTS

Figure 4:
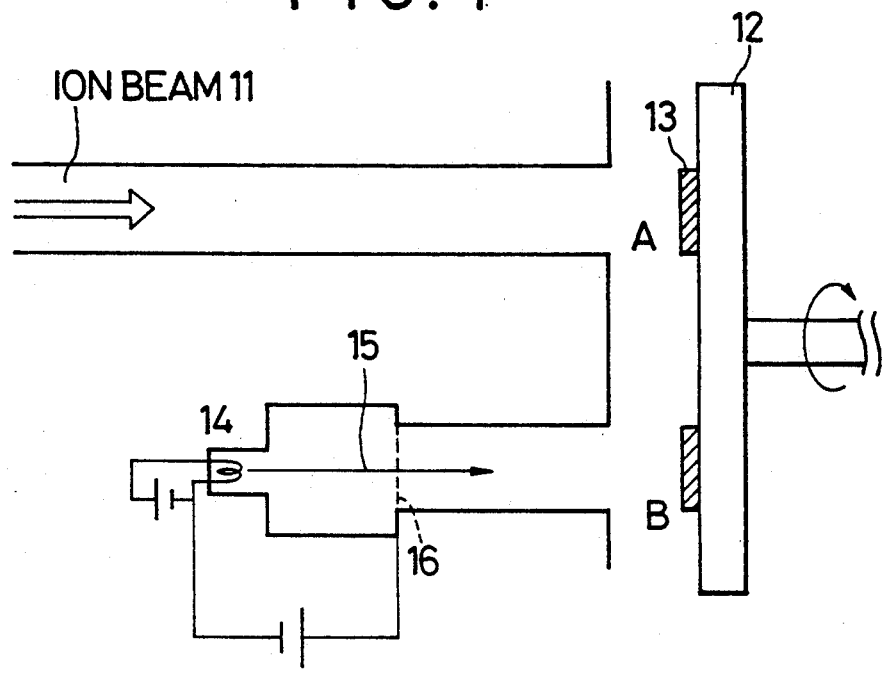
FIG. 4 is a cross section of an ion implantation apparatus showing an embodiment of this invention.

In FIG. 4, reference numeral 14 shows an electron generating source, and numeral 16 designates a grid for accelerating electrons and controlling the energy of an electron beam 15.

The electron beam 15 is controlled by adjusting an amount of an electric current flowing in a W (tungsten) wire (not shown) in the electron generating source 14. While, reference numeral 11 denotes an ion beam, numeral 12 is a rotatable disc, and numeral 13 is a semiconductor substrate. The ion implantation apparatus of this embodiment is composed of the above-mentioned parts. The accelerated electron beam 15 is introduced onto the substrate 13 on the disc 12 located at a position B.

Next, operation of the ion implantation apparatus is explained.

The ion beam 11 generated from an ion source (not shown) is accelerated and introduced onto substrate 13 located at a position A. Since the disc 12 is rotated during operation, the substrate 13 is irradiated with the ion beams 11 one after another at predetermined intervals. Then, the substrate 13 in which ions implanted from the ion beams 11 are moved to position B successively by the rotation of the disc 12. Thereafter, the substrate 13 is irradiated with the highly accelerated electron beam 15.

The current density of the electron beam 15 depends on the dose of the ion implantation and the rotation speed of the disc 12, however, the value is so set as to be about 1/5 to 1/10 as compared with the current density based on the ions to be implanted in substrate 13. In setting the energy for accelerating the electrons, it is necessary to consider the surface structure of the substrate 13. Generally, it can be suitably set in the range from about 1 to 50 kev.

As described above, the current density of the electron beam 15 depends on the dose of ion implantation and the rotation speed of the disc 12 to generate the EBIC (electron beam induced current) for removing positive electric charges 28 accumulated on the surface of the semiconductor substrate 21. In the embodiment, the value of the current density of the electron beam 15 is so set as to be about 1/5 to 1/10 as compared with the current density of the ions to be implanted in the substrate 13. The range of the ratio from 1/5 to 1/10 means the range of the current density of the electron beam from 141 to 70 $[\mu A/cm^2]$.

However, this invention is not limited to the above ranges. The range of the current density of the electron beam need not always be from 141 to 70 $(\mu A/cm^2]$, because a lower range of the current density of the electron beam also has the same effect of generating an EBIC to eliminate electric charges accumulated on a substrate. For example, the lower range of the current density of the electron beam is approximately from 70 to 7 $[\mu A/cm^2]$. In this embodiment, the current density of the electron beam is set to be about 1/100 to 1/10 of the current density of the ions to be implanted in substrate 13. Note the following equations for computing current density:

$$5.0\ (mA) \div [(1.5)2 \times \pi(cm^2)] = 0.7077 \times 10^{-3}\ [A/cm^2];$$

$$0.7077 \times 10^{-3} [A/cm^2] \times 1/100 = \text{approximately } 7\ [\mu A/cm^2];\ \text{and}$$

$$0.7077 \times 10^{-2} [A/cm^2] \times 1/10 = \text{approximately } 70\ [\mu A/cm^2].$$

Figure 5:
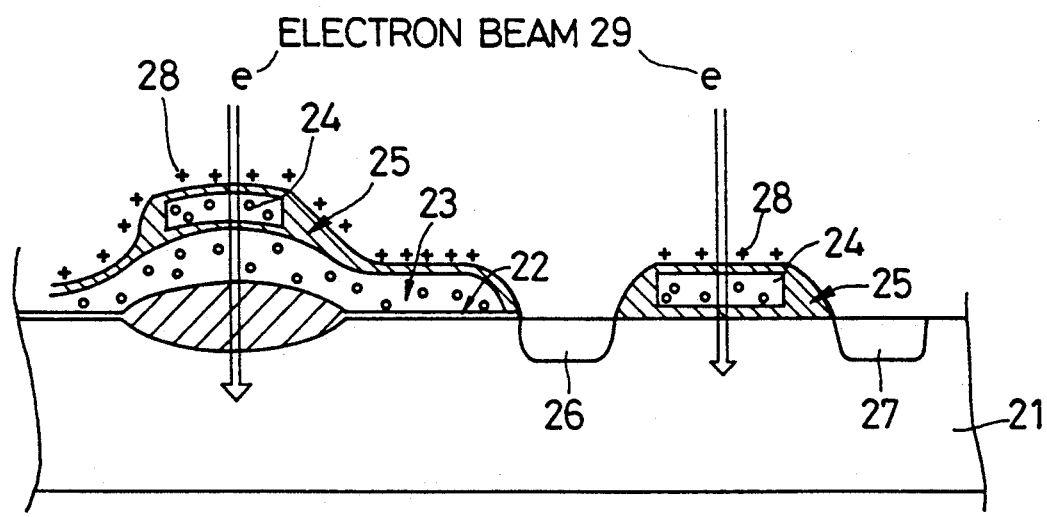
FIGS. 5 and 6 are cross sections of a wafer showing the electron beam induced current (EBIC)

FIG. 5 is a cross section schematically showing the charge-up phenomenon in the surface of a semiconductor substrate 21 in a typical DRAM structure. The DRAM structure includes a Si substrate 21, an insulating ($SiO_2$) film 22, a polysilicon electrode 23 for accumulating electrons, another polysilicon electrode 24 of a transistor for readout, and an LDD spacer 25 (as $SiO_2$ formed by CVD) Moreover, 2 6 and 2 7 shows a source region and a drain region of the transistor, and each of these regions is formed by an ion implantation with a high dose.

Figure 6:
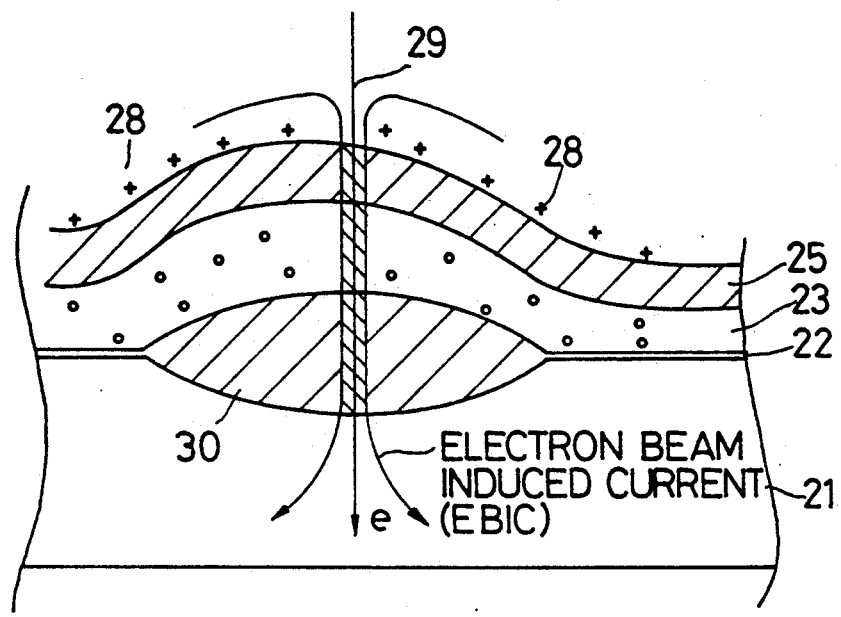

FIG. 6 shows an enlarged view of the portion shown in FIG. 5, and having been irradiated with the ion beam.

In such a case, a region (usually having a diameter from 30 to 50 mm) irradiated with the ion beam is charged positively by positive electric charge 28 (designated by the character of 11+11). Then, a highly accelerated electron beam 29 is irradiated onto the positively charged region. Thereby, the positive electric charges 28 are introduced toward the substrate 21 with an electron beam 29. As the result, the electron beam induced current (EBIC) is generated so as to remove the positive electric charges 28 in the surface of the semiconductor substrate 21.

In this embodiment, arsenic (As) ions are accelerated under an acceleration voltage of 50 kev so as to generate the ion beam. Moreover, the dose of the ion beam is set at $1 \times 10^{16}$ cm$^{-2}$ and the beam diameter thereof is controlled to be 30 mm under a current value of 5 mA. On the other hand, the acceleration voltage of the electron beam 29 is set at 50 kev under a current value of 50 μA.

Figure 1:
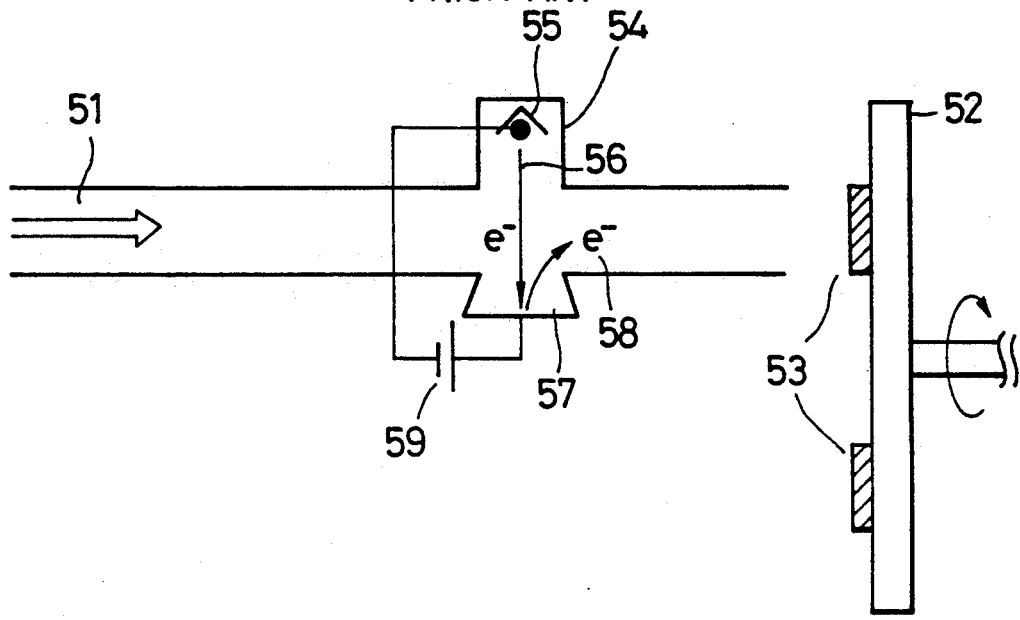
FIG. 1 is a cross section to show the composition of a conventional ion implantation apparatus.
Figure 2:
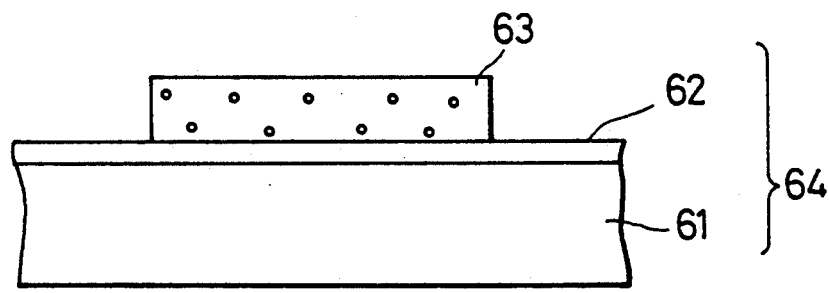
FIG. 2 is a cross section of a semiconductor substrate used for an insulation test.
Figure 3:
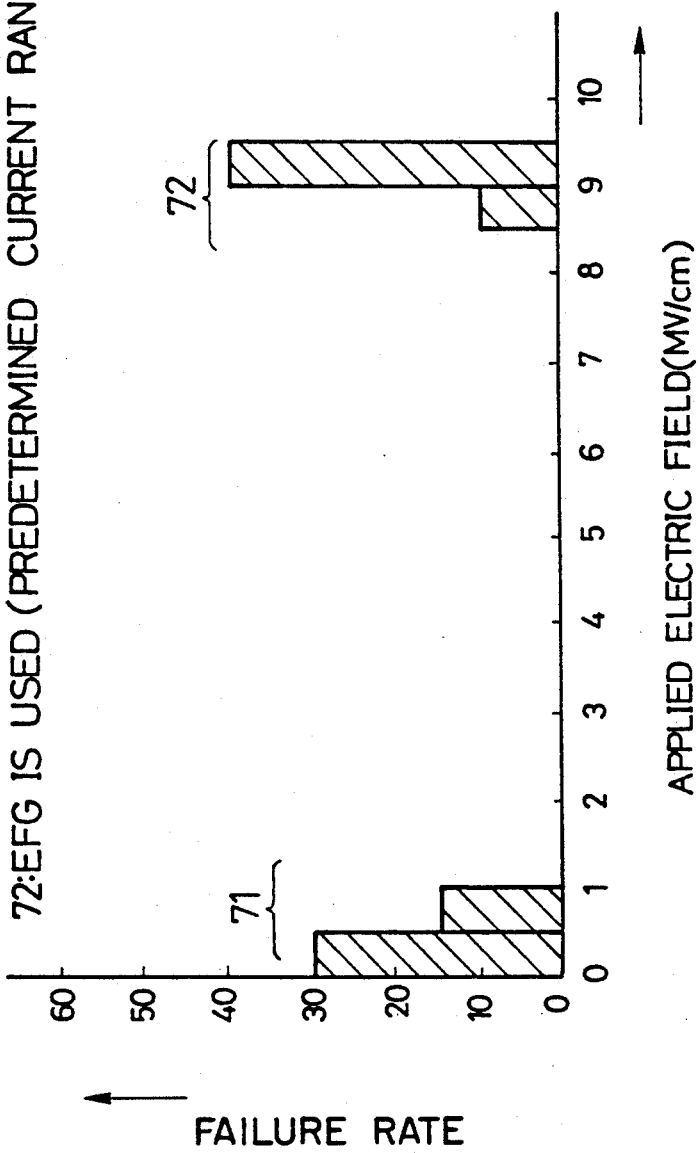
FIG. 3 is a cross section to show the composition of an ion implantation apparatus which is an embodiment of the present invention.

After ion implantation is completed under the conditions mentioned above, the substrate is annealed for 30 minutes at 900° C. in an $N_2$ atmosphere. Then, the resultant substrate is subjected to the insulation test with respect to the $SiO_2$ film 22. As the result, the initial failure mode (A mode) designated by 71 shown in FIG. 3 can be eliminated.

Figure 7:
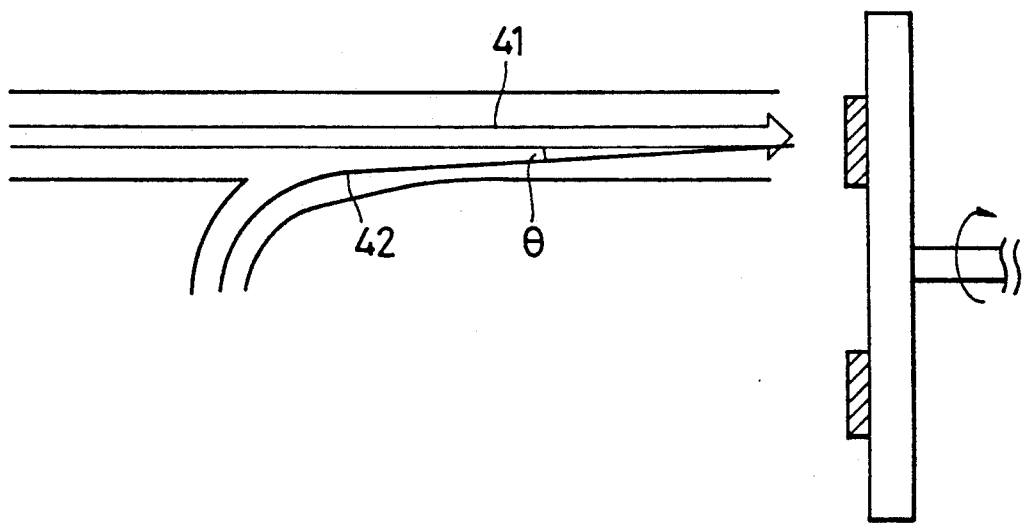
FIG. 7 is a cross section to show the composition of an ion implantation apparatus which is another embodiment of the present invention.

FIG. 4 shows a method of irradiating the substrate 13 with a highly accelerated electron beam 15 and a highly accelerated ion beam separately. On the other hand, as shown in FIG. 7, it is also possible to irradiate these beams (the electron beam 15 and the ion beam 11) onto substantially the same portions at the same time. Namely, as shown in FIG. 7, an electron beam 42 may be joined with an ion beam 41 by bending the electron beam 42 by use of a magnetic field (not shown).

Moreover, in the embodiments respectively shown in FIGS. 4 and 7, the operations for irradiating the ion beam and electron beam are carried out independently of each other. However, it is possible to carry out both operations (irradiating with the ion beam and the electron beam) in synchronism with each other.

Various modifications will become possible for those skilled in the art after receiving the teachings of the present disclosure without departing from the scope thereof.

What is claimed is:

1. A method of removing electric charge accumulated on a semiconductor substrate during ion implantation, comprising the steps of:

implanting ions by irradiating an ion beam onto the semiconductor substrate to form an impurity layer therein; and irradiating an accelerated electron beam onto a predetermined portion of the semiconductor substrate simultaneously with the ion beam;

wherein, the electron beam is accelerated with an acceleration voltage, the range of the acceleration voltage being from 1 to 50 KeV, the range of the current density of the electron beam being from approximately 70 to 141 μA/cm$^2$, and the electric charge being eliminated through the semiconductor substrate by an electron beam induced current caused by irradiating the accelerated electron beam.

2. A method according to claim 1, wherein the accelerated electron beam is joined with the ion beam, and irradiated onto a predetermined portion of the semiconductor substrate together with the ion beam.

3. A method of removing electric charge accumulated on a semiconductor substrate during ion implantation, comprising the steps of:

implanting ions by irradiating an ion beam onto the semiconductor substrate to form an impurity layer therein; and irradiating an accelerated electron beam having a difference in irradiating time from the ion beam onto a predetermined portion of the semiconductor substrate, wherein the electron beam is accelerated with an acceleration voltage, the range of the acceleration voltage being 1 to 50 KeV, and the range of the current density of the electron beam being from 70 to 141 μA/cm$^2$ the electric charge being eliminated through the semiconductor substrate by an electron beam induced current caused by irradiating the accelerated electron beam.

4. A method of removing electric charges accumulated on a semiconductor substrate during ion implantation, comprising the steps of:

implanting ions by irradiating an ion beam onto the semiconductor substrate to form an impurity layer therein; and irradiating an accelerated electron beam onto a predetermined portion of the semiconductor substrate simultaneously with the ion beam;

wherein the accelerated electron beam is accelerated with an acceleration voltage, the range of acceleration voltage being from 1 to 50 KeV, a range of the current density of the electron beam being from approximately 7 to 70 μA/cm$^2$, and the electric charge is eliminated through the semiconductor substrate by an electron beam induced current caused by irradiating the accelerated electron beam.

5. The method of claim 1, wherein the electron beam is irradiated onto a predetermined portion of the semiconductor substrate at a different time than is the ion beam.

6. The method of claim 4, wherein the electron beam is irradiated onto a predetermined portion of the semiconductor substrate at a different time than is the ion beam.

* * * * *